United States Patent [19]

Nicolai et al.

[11] Patent Number: 6,072,119
[45] Date of Patent: Jun. 6, 2000

[54] WALL-MOUNTED FILTER ARRANGEMENT FOR BLOCKING HIGH-FREQUENCY ELECTROMAGNETIC RADIATION

[75] Inventors: Walter Nicolai, Buseck; Adam Pawlowski, Eschenburg-Wissenbach; Wolfgang Schuler, Ehringshausen; Heinrich Strackbein, Biebertal, all of Germany

[73] Assignee: Rittal-Werk Rudolf Loh GmbH & Co. KG, Herborn, Germany

[21] Appl. No.: 08/913,685

[22] PCT Filed: Mar. 20, 1996

[86] PCT No.: PCT/EP96/01199

§ 371 Date: Feb. 10, 1998

§ 102(e) Date: Feb. 10, 1998

[87] PCT Pub. No.: WO96/31999

PCT Pub. Date: Oct. 10, 1996

[30] Foreign Application Priority Data

Apr. 1, 1995 [DE] Germany ............... 195 12 326

[51] Int. Cl.[7] ....................................... H05K 9/00
[52] U.S. Cl. ................ 174/35 R; 165/80.3; 454/207; 454/208
[58] Field of Search ............... 174/35 R, 16.1; 361/800, 816, 818, 694, 695, 712, 714, 715; 165/80.3; 312/236; 454/184, 207, 208

[56] References Cited

U.S. PATENT DOCUMENTS

| 3,446,906 | 5/1969 | Zulauf | 174/35 |
| 5,007,946 | 4/1991 | Babini | 55/501 |

FOREIGN PATENT DOCUMENTS

| 0 397 616 | 5/1990 | European Pat. Off. . |
| 0413 518 A2 | 5/1990 | European Pat. Off. . |

*Primary Examiner*—Kristine Kincaid
*Assistant Examiner*—Hung V Ngo
*Attorney, Agent, or Firm*—Jannson, Shupe, Bridge & Munger, Ltd.

[57] ABSTRACT

The invention relates to a filtering device with a filter housing which can accept a filter mat, is covered with a lamella grid on the outlet side and is fitted in an aperture in a mounting wall. RF screening is attained without altering the structure of the filtering device in that the surface of the filter housing is electrically conductive and inserted in the aperture in the mounting plate via an electrically conductive contact frame. The contact frame is electrically connected to the filter housing and the aperture in the mounting plate and there is an electrically conductive screening grid inserted or mounted in the filter housing or between the latter and a fan which can be linked thereto.

11 Claims, 2 Drawing Sheets

WALL-MOUNTED FILTER ARRANGEMENT FOR BLOCKING HIGH-FREQUENCY ELECTROMAGNETIC RADIATION

FIELD OF THE INVENTION

This invention is related generally to electromagnetic radiation and, more particularly, to filter arrangements that block such radiation.

BACKGROUND OF THE INVENTION

Filter arrangements that are inserted into a mounting wall are known in the art. Many such filters are substantially structurally similar to one another, irrespective of whether they are constructed with or without a fan. Insofar as is known, there are no such filters that have the capability to exclude or block high-frequency (HF) electromagnetic radiation. Given the requirements to use filters in sensitive and interference prone electronic devices, a filter arrangement that would afford protection from HF radiation would be an important improvement in the art.

OBJECTS OF THE INVENTION

It is an object of this invention to provide a filter arrangement overcoming some of the problems and shortcomings of devices of the prior art.

Another object of this invention is to provide a filter arrangement that is HF-impervious. How these and other important objects are accomplished will be apparent from the following descriptions and from the drawings.

SUMMARY OF THE INVENTION

The invention involves a filter arrangement comprised of: (1) an assembly plate having an aperture in its center; (2) an electrically conductive contact frame inserted into the aperture of the assembly plate; (3) a filter housing having an outlet side, an inlet side and a center opening, connected to the contact frame; (4) a filter mat placed in the opening in the filter housing; (5) an electrically conductive grid located between the filter housing and the filter mat; and (6) a lamellar screen covering the filter mat.

In a preferred embodiment of the invention, a fan is attached to the inlet side of the filter housing and the electrically conductive grid is positioned between the filter housing and the fan. In a more specific version of this embodiment, the fan has an outlet and inlet side and the inlet side of the fan is covered by a protective screen. In still another version, the fan projects through both the contact frame and the aperture of the mounting plate.

In another aspect of the invention, the filter housing is constructed of plastic in which electrically-conductive material is mixed or which has been "metallized" or vapor-coated with a conductive substance so as to be electrically conductive. In another embodiment of the invention, the filter housing has a receptacle formed into its outlet side and the filter mat and grid are inserted into the receptacle.

In yet another aspect of the invention, the filter housing has a circumscribing fastening flange with fastening bore holes and screws passing through the fastening bore holes to secure the filter housing to the mounting plate. In a specific version of such preferred embodiment, the mounting plate has a contact surface surrounding the aperture and the contact surface contains a plurality of screw receptacles arranged around the aperture.

In still another aspect of the invention, the inlet side of the filter housing is covered by a mesh holding screen and such holding screen supports the grid and filter mat. The holding screen may be constructed in one piece together with the filter housing.

In yet another aspect of the invention, the contact frame projects into the aperture of the assembly plate. The first and second edges of each of a plurality of contact springs contact the plate and the filter housing, respectively, so as to electrically connect the plate and the filter housing to one another.

DETAILED DESCRIPTIONS OF THE PREFERRED EMBODIMENTS

Figure 1:
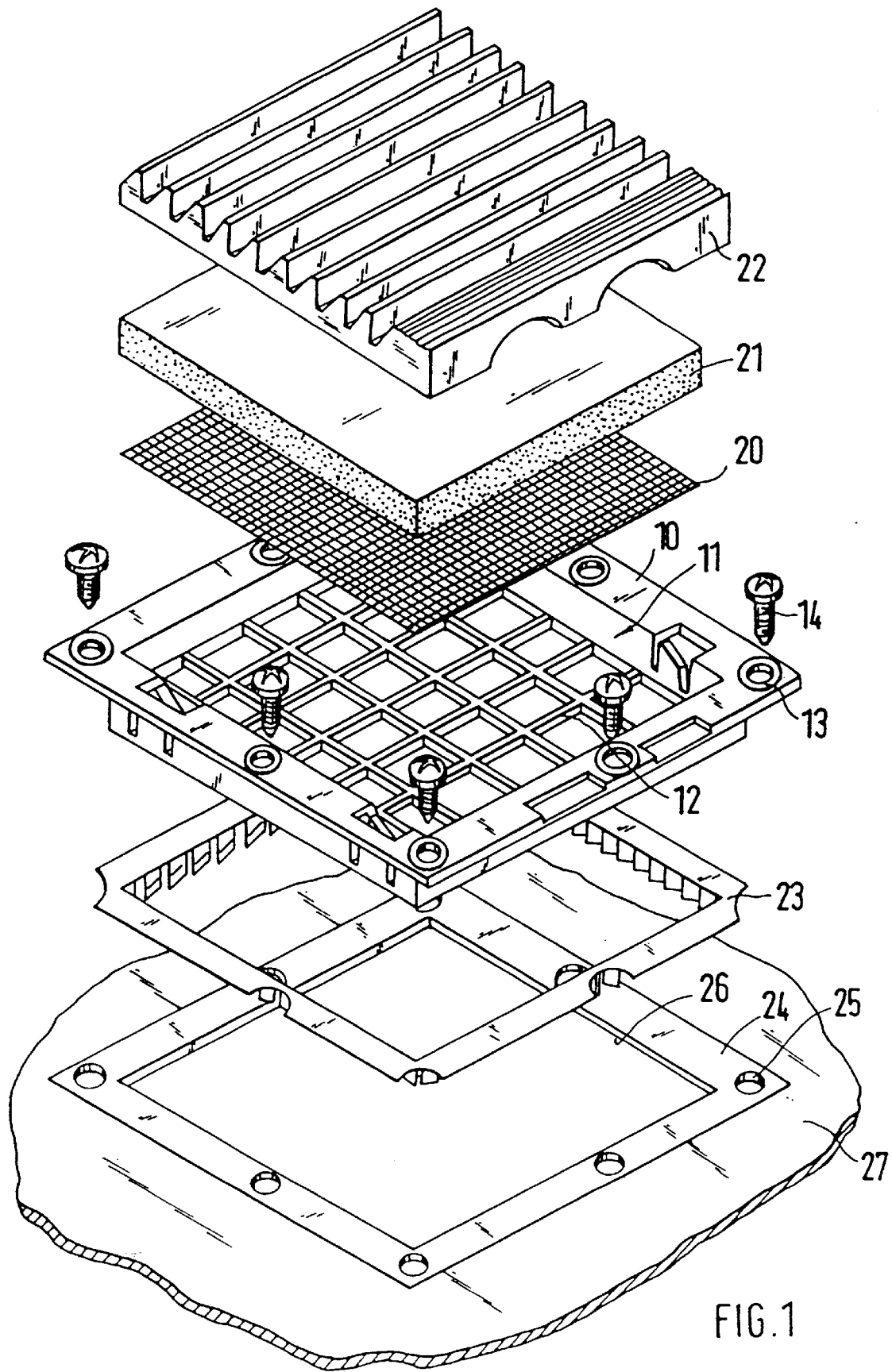
FIG. 1 is an exploded perspective view of an embodiment of the inventive filter arrangement.

As can be seen in FIG. 1, the invention involves a filter arrangement comprised of a mounting plate 27, such as the wall of a device in a control cabinet, having an aperture 26 surrounded by a contacting surface 24 with screw receptacles 25 or fastening holes. A contact frame 23 comprised of electrically conductive material is inserted into aperture 26 of mounting plate 27. A filter housing 10 having an outlet side and an inlet side and a center opening is connected to contact frame 23. A filter mat 21 is placed in the opening in filter housing 10 along with an electrically conductive grid 20 located in series airflow relationship with filter housing 10 and filter mat 21. "Series airflow relationship," as used herein, is defined as allowing the air to flow concurrently through grid 20, filter housing 10 and filter mat 21. Finally, a lamellar screen 22 covers filter mat 21.

Figure 2:
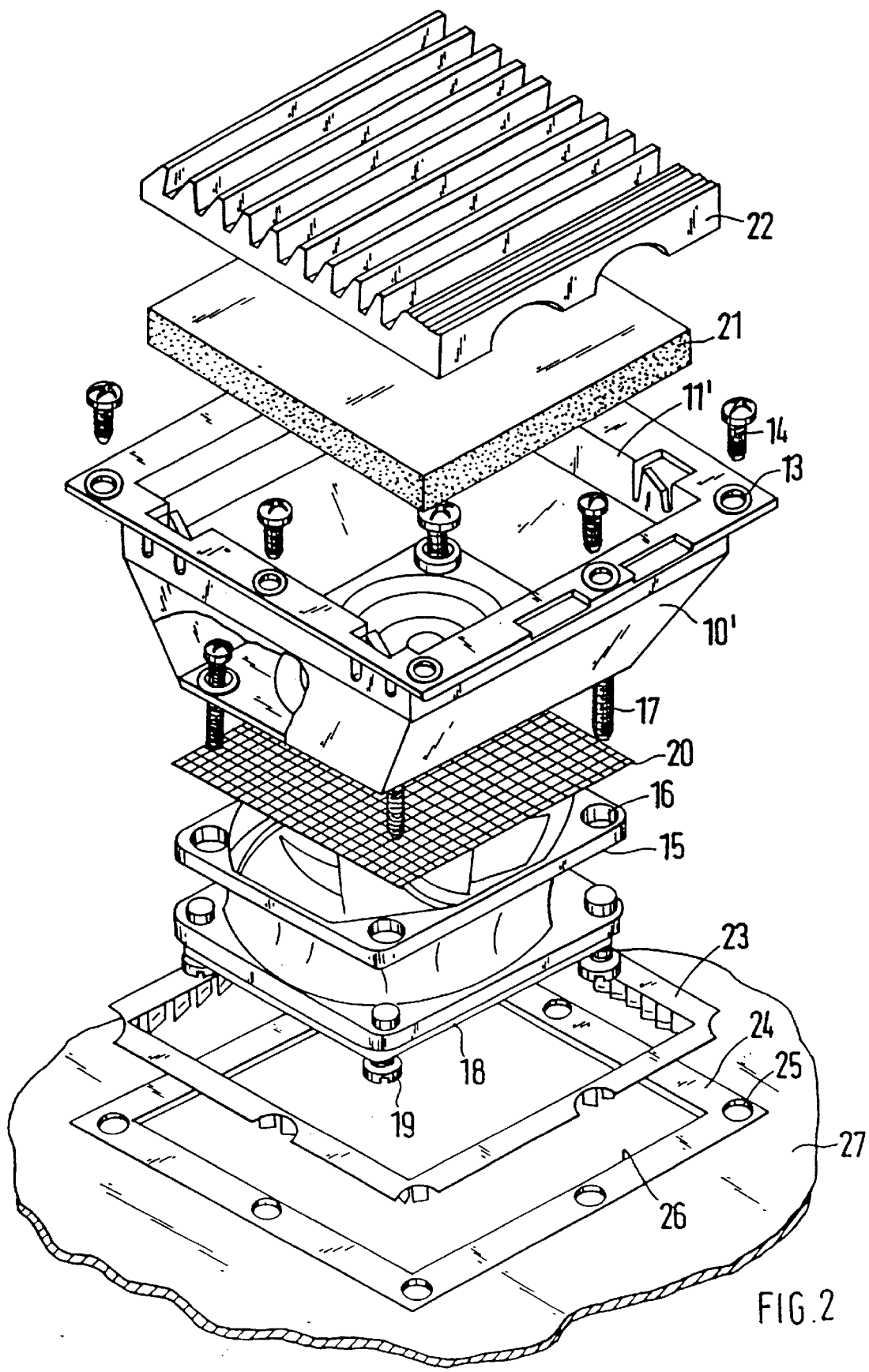
FIG. 2 is an exploded perspective view of another embodiment of the filter arrangement including a fan.
Figure 1:
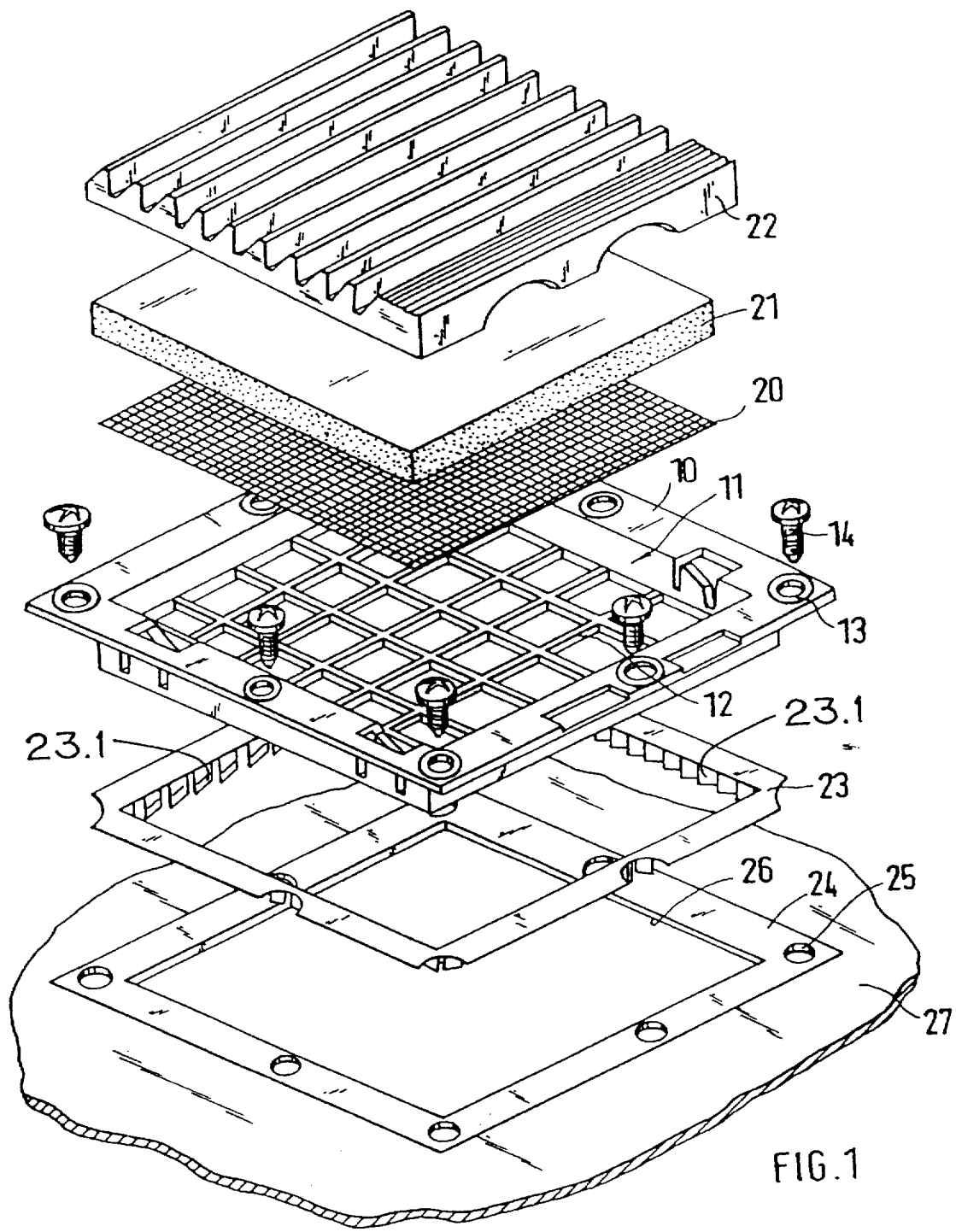
Figure 2:
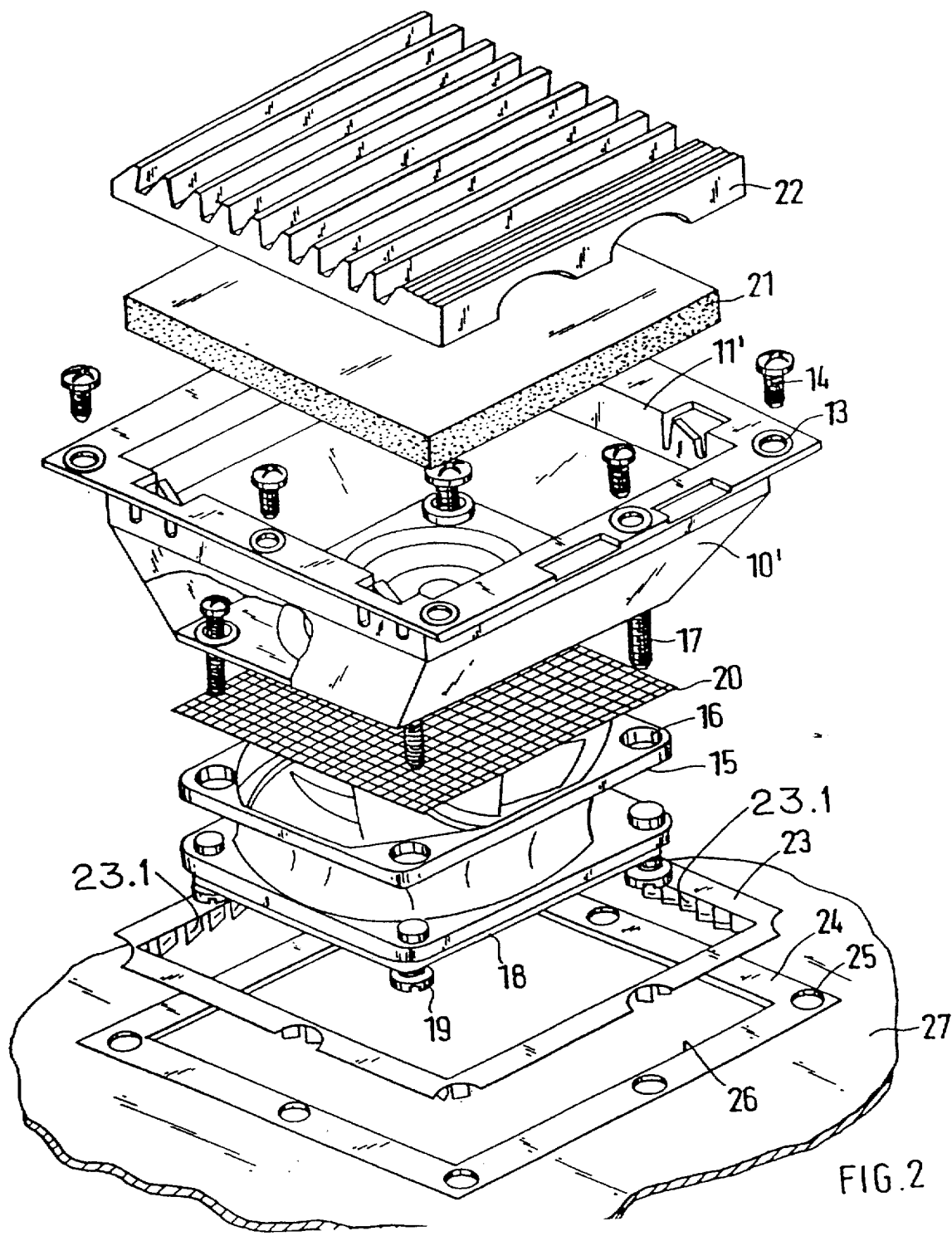

In a preferred embodiment of the invention, as shown in FIG. 2, a fan 16 is attached to the inlet side of filter housing 10' and electrically conductive grid 20 is positioned between filter housing 10' and fan 16. In this embodiment, fan 16 is secured to filter housing 10 through the use of screws 19 that pass through housing 10 and fastening flange 15 of fan 16. The contact frame 23, grid 20 and filter housing 10 provided with an electrically conductive surface seals aperture 26 in an HF-impervious manner. In a more specific version of this embodiment, fan 16 has an outlet and inlet side and the inlet side of fan 16 is covered by a protective screen 18. In still another version, fan 16 projects through both contact frame 23 and aperture 26 of mounting plate 27.

The grid 20 used in all versions of the embodiment involving a fan 16 has a finer mesh than holding screen 12 used in the embodiment without a fan 16. The grid 20 which also has a finer mesh than one of protective screens 18 that is connected to the outlet side of fan 16 can be comprised of plastic and be provided with an electrically conductive surface.

In another aspect of the invention, filter housing 10 is constructed of plastic in which electrically-conductive material is mixed or which has been "metallized" or vapor-coated with a conductive substance so as to be electrically conductive thereby allowing filter housing 10 and contact frame 23 to be connected to each other in an electrically conductive manner. In another embodiment of the invention, filter housing 10 has a receptacle formed into its outlet side and filter mat 21 and grid 20 are inserted into the receptacle.

The filter mat 21 and grid 20 are supported in housing 10 by means of a holding screen 12 which is constructed with a course mesh and is advantageously constructed as one piece together with filter housing 10. A lamellar screen 22 covers the outside of the filter arrangement in a known manner. According to one embodiment, contact frame 23 that supports the HF-shielding uses copper-beryllium. Because of this, aperture 26 in mounting plate 27 is rendered HF impervious (i.e., the filter arrangement in aperture 26 is shielded in the direction of mounting plate 27).

In yet another aspect of the invention, filter housing 10 has a circumscribing fastening flange with fastening bore holes 13 and screws 14 passing through fastening bore holes 13 to secure the filter housing 10 to mounting plate 27. In a specific version of such preferred embodiment, mounting plate 27 has a contact surface 24 surrounding aperture 26 and contact surface 24 contains a plurality of screw receptacles 25 arranged around aperture 26.

In still another aspect of the invention, contact frame 23 projects into aperture 26 of mounting plate 27. The first and second edges of each of a plurality of contact springs 23.1 contact mounting plate 27 and filter housing 10, respectively, so as to electrically connect mounting plate 27 and filter housing 10 to one another.

Although the contacting surface of contact frame 23 is usually applied to mounting plate 27, it can also be a part that is separate from mounting plate 27. For example, contacting surface 24 can be inserted into aperture 26 of mounting plate 27 and connected to it in an electrically conductive manner. Also, the electrical conductivity of the surface of filter housing 10 and a plastic contact frame 23 can be achieved by other means such as through the use of plastic in which an electrically-conductive material has been mixed.

A complete HF shielding of aperture 26 of the mounting plate 27 is always totally achieved since mounting plate 27, contact frame 23 and filter housing 10 are connected to grid 20 in an electrically conductive manner thereby covering aperture 26 and shielding it.

While the principles of this invention have been described in connection with specific embodiments, it should be understood clearly that these descriptions are made only by way of example and are not intended to limit the scope of the invention.

What is claimed:

1. A filter arrangement comprised of:

a mounting plate having an aperture;

an electrically conductive contact frame extending into the aperture;

a filter housing connected to the contact frame and having an outlet side, an inlet side and a central opening;

a filter mat in the opening in the filter housing;

an electrically conductive grid in series airflow relationship with the filter housing and the filter mat; and a lamellar screen over the filter mat.

2. The filter arrangement of claim 1 wherein:

a fan is attached to the inlet side of the filter housing; and the electrically conductive grid is between the filter housing and the fan.

3. The filter arrangement according to claim 1 wherein:

the filter housing is constructed of plastic; and the plastic is coated with an electrically conductive material.

4. The filter arrangement according to claim 1 wherein:

the filter housing has a receptacle formed in the outlet side; and the filter mat and grid are inserted into the receptacle.

5. The filter arrangement according to claim 1 wherein:

the filter housing includes a circumscribing fastening flange having fastening bore holes; and screws extending through the fastening bore holes secure the filter housing to the mounting plate.

6. The filter arrangement of claim 5 wherein:

the mounting plate has a contact surface surrounding the aperture; and the contact surface includes a plurality of screw receptacles arranged around the aperture.

7. The filter arrangement of claim 1 wherein:

the inlet side of the filter housing is covered by a mesh holding screen; and the mesh holding screen supports the grid and filter mat.

8. The filter arrangement according to claim 7 wherein the mesh holding screen is constructed in one piece together with the filter housing.

9. The filter arrangement according to claim 2 wherein:

the fan has an outlet and inlet side; and the inlet side of the fan is covered by a protective screen.

10. The filter arrangement of claim 1 wherein each of a plurality of contact springs extend between the mounting plate and the filter housing, thereby electrically connecting the mounting plate and filter housing.

11. The filter arrangement of claim 2 wherein the fan projects through the contact frame and the aperture of the mounting plate.

* * * * *

UNITED STATES PATENT AND TRADEMARK OFFICE
CERTIFICATE OF CORRECTION

Page 1 of 3

PATENT NO. : 6,072,119
DATED : June 6, 2000
INVENTOR(S) : Walter Nicolai, Adam Pawlowski, Wolfgang Schuler, and Heinrich Strackbein It is certified that error appears in the above-identified patent and that said Letters Patent are hereby corrected as shown below:

In the drawings:

Delete: Figure 1 and Figure 2

Replace with: Attached Figure 1 and Figure 2 identifying reference character 23.1

Signed and Sealed this

Twenty-fourth Day of April, 2001

*Attest:*

NICHOLAS P. GODICI

*Attesting Officer*     Acting Director of the United States Patent and Trademark Office